(12) United States Patent
Kim et al.

(10) Patent No.: US 10,762,950 B2
(45) Date of Patent: Sep. 1, 2020

(54) BUFFER CONTROL CIRCUIT OF MEMORY DEVICE

(71) Applicant: SK hynix Inc., Gyeonggi-do (KR)

(72) Inventors: Kyung-Mook Kim, Gyeonggi-do (KR); Sang-Ah Hyun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/218,715

(22) Filed: Dec. 13, 2018

(65) Prior Publication Data

US 2020/0058345 A1    Feb. 20, 2020

(30) Foreign Application Priority Data

Aug. 14, 2018   (KR) .......................... 10-2018-0094932

(51) Int. Cl.
*G11C 8/00*        (2006.01)
*G11C 11/4093*     (2006.01)
(Continued)

(52) U.S. Cl.
CPC .......... *G11C 11/4093* (2013.01); *G11C 7/109* (2013.01); *G11C 7/1057* (2013.01);
(Continued)

(58) Field of Classification Search
CPC . G11C 11/4093; G11C 7/1057; G11C 7/1063; G11C 7/1084; G11C 7/109;
(Continued)

(56) References Cited

U.S. PATENT DOCUMENTS 6,091,277 A * 7/2000 Fujii .............. G01R 31/318572
                                                            327/403
6,530,006 B1 * 3/2003 Dodd .................. G06F 13/4239
                                                             710/52
(Continued)

FOREIGN PATENT DOCUMENTS

KR    1020100078691     7/2010
KR    1020110130068    12/2011

*Primary Examiner* — Pho M Luu
(74) *Attorney, Agent, or Firm* — IP & T Group LLP

(57) ABSTRACT

A memory device includes a target clock generation circuit suitable for generating a target clock by dividing a frequency of an internal clock at a set ratio, a delay circuit suitable for generating first to $N^{th}$ delay clocks having first to $N^{th}$ pulse widths that gradually increase, in synchronization with the target clock, a flag detection circuit suitable for filtering the first to $N^{th}$ delay clocks based on the target clock to generate first to $N^{th}$ flag signals and decoding the first to $N^{th}$ flag signals to generate first to $(N-1)^{th}$ current control signals, and a buffer circuit suitable for adjusting an amount of current based on the first to $(N-1)^{th}$ current control signals, and buffering an externally inputted signal using the adjusted amount of current.

22 Claims, 14 Drawing Sheets

(51) Int. Cl.
*G11C 11/4076* (2006.01)
*G11C 11/408* (2006.01)
*G11C 7/10* (2006.01)
*G11C 7/22* (2006.01)
*G11C 11/4096* (2006.01)

(52) U.S. Cl.
CPC .......... *G11C 7/1063* (2013.01); *G11C 7/1084* (2013.01); *G11C 7/222* (2013.01); *G11C 11/4076* (2013.01); *G11C 11/4082* (2013.01); *G11C 11/4087* (2013.01); *G11C 11/4096* (2013.01)

(58) Field of Classification Search
CPC . G11C 7/222; G11C 11/4076; G11C 11/4082; G11C 11/4087; G11C 11/4096
See application file for complete search history.

(56) References Cited

U.S. PATENT DOCUMENTS

| | | | |
|---|---|---|---|
| 6,546,510 B1 * | 4/2003 | Mazumder | G11C 29/38 365/201 |
| 7,609,553 B2 * | 10/2009 | Hwang | G11C 7/1027 365/185.17 |
| 9,007,861 B2 | 4/2015 | Miyano | |
| 9,847,113 B2 * | 12/2017 | Choi | G11C 7/222 |

* cited by examiner

FIG. 4

| DATA TRANSFER RATE (MT/s) | DELAY CLOCK | FLAG SIGNAL | CURRENT CONTROL SIGNAL | CURRENT INCREASE AMOUNT (EXAMPLE) |
|---|---|---|---|---|
| 3500 or higher | DLY_2.5NS | S3500 | MAX_CR | +20uA INCREASED (bias current 32%) |
| 3200 or higher and less than 3500 | DLY_2.5NS, DLY_3.0NS | S3500, S3200 | HIGH_CR | +15uA INCREASED (bias current 24%) |
| 2667 or higher and less than 3200 | DLY_2.5NS~DLY_3.5NS | S3500, S3200, S2667 | MID_CR | +10uA INCREASED (bias current 16%) |
| 2133 or higher and less than 2667 | DLY_2.5NS~DLY_4.5NS | S3500, S3200, S2667, S2133 | LOW_CR | +5uA INCREASED (bias current 8%) |
| less than 2133 | DLY_2.5NS~DLY_6.0NS | S3500, S3200, S2667, S2133, S1600 | -- | -- |

BUFFER CONTROL CIRCUIT OF MEMORY DEVICE

CROSS-REFERENCE TO RELATED APPLICATION(S)

This application claims priority under 35 U.S.C. § 119 to Korean Patent Application No. 10-2018-0094932, filed on Aug. 14, 2018, in the Korean Intellectual Property Office, the disclosure of which is incorporated herein by reference in its entirety.

BACKGROUND

1. Field

Various exemplary embodiments of the present disclosure generally relate to a semiconductor design technique. Particularly, the disclosure relates to a memory device including a buffer circuit capable of controlling the amount of current therein according to an operation speed.

2. Description of the Related Art

In general, a memory module having a plurality of memory devices mounted on a module board is adopted as a memory for storing data, in a data processing system such as a personal computer (PC), a workstation, a server computer or a communication system.

Recently, high-speed data processing is required for the rapid development of multimedia. Thus, the operation frequency of memory devices mounted on a memory module tends to be gradually increased in order to raise the operation speed of a data processing system. Accordingly, while signal distortion due to signal reflection and signal interference on a transmission line is intensified, it is difficult to secure signal integrity (SI), thereby causing a concern of limiting a high-speed operation.

For example, a synchronous dynamic random access memory (SDRAM) having a double-data-rate (DDR) type in which data is transferred in synchronization with a rising edge and a falling edge of a system clock is being developed into a DDR2 SDRAM and a DDR3 SDRAM with increasingly improved operation speed. Accordingly, it is more necessary to secure the signal integrity (SI) in a memory module equipped with the SDRAM subsequent to the DDR3 SDRAM.

SUMMARY

Various embodiments of the present invention are directed to a semiconductor device including a buffer circuit capable of controlling the amount of current therein according to an operation speed.

In accordance with an embodiment of the present invention, a memory device includes: a target clock generation circuit suitable for generating a target clock by dividing a frequency of an internal clock at a set ratio, a delay circuit suitable for generating first to $N^{th}$ delay clocks having first to $N^{th}$ pulse widths that gradually increase, in synchronization with the target clock, a flag detection circuit suitable for filtering the first to $N^{th}$ delay clocks based on the target clock to generate first to $N^{th}$ flag signals and decoding the first to $N^{th}$ flag signals to generate first to $(N-1)^{th}$ current control signals, and a buffer circuit suitable for adjusting an amount of current based on the first to $(N-1)^{th}$ current control signals, and buffering an externally inputted signal using the adjusted amount of current.

In accordance with an embodiment of the present invention, a memory system includes: a plurality of memory devices; and a memory controller suitable for transferring and receiving data to and from the memory devices and providing a command/address signal, a clock enable signal, a global reset signal and an external clock to control the memory devices, wherein each of the memory devices includes: a clock buffer circuit suitable for receiving the external clock based on the clock enable signal to output an internal clock; a buffer control circuit suitable for generating a current control signal corresponding to a frequency of the internal clock during a standby period defined by the clock enable signal and the global reset signal; and a buffer circuit suitable for adjusting an amount of current based on the current control signal and buffering the command/address signal, the control signal and the data using the adjusted amount of current.

BRIEF DESCRIPTION OF THE DRAWINGS

FIG. 4 is a table for describing a relationship between the amount of current consumption depending on a data transfer rate of a memory device and signals of the buffer control circuit shown in FIG. 3.

DETAILED DESCRIPTION

Figure 1:
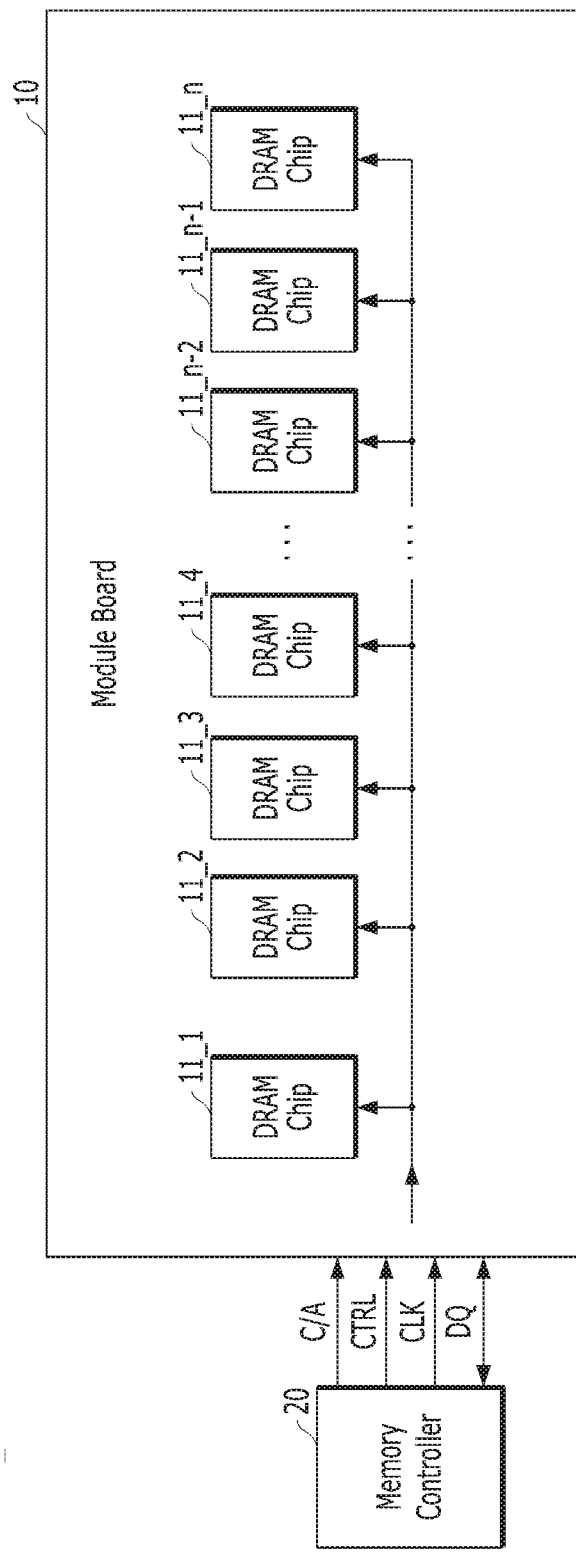
FIG. 1 is a block diagram schematically illustrating a memory system in accordance with an embodiment of the present disclosure.

Various exemplary embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, a memory system including a memory device as an example of a semiconductor device will be described. However, the present disclosure is not limited thereto, and may be applied to various semiconductor devices and integrated circuits.

FIG. 1 is a block diagram schematically illustrating a memory system 1 in accordance with an embodiment of the present disclosure.

Referring to FIG. 1, the memory system 1 may include a memory module 10 and a memory controller 20. The memory controller 20 may transfer and receive data DQ to and from the memory module 10, and provide a command/address signal C/A, a control signal CTRL and a clock CLK to control the memory module 10. For example, the control signal CTRL may include a chip selection signal CS, a clock enable signal CKE, a global reset signal RSTB and so on.

The memory module 10 may include one or more memory chips. For example, the memory module 10 may include a plurality of memory chips mounted on a top surface and/or a bottom surface of a module board. FIG. 1 illustrates the memory module 10 including first to $n^{th}$ memory chips 11_1 to 11_$n$ that are disposed on the top surface of the module board, where "n" is a natural number.

The first to $n^{th}$ memory chips 11_1 to 11_$n$ may be disposed adjacent to one another along one or more buses. For example, the first to $n^{th}$ memory chips 11_1 to 11_$n$ may be disposed adjacent to one another along a data DQ bus, a command/address signal C/A bus, a control signal CTRL bus and a clock CLK bus. For convenience in description and illustration, FIG. 1 illustrates only a single bus. However, the number of buses may vary depending on the design requirement.

Each of the first to $n^{th}$ memory chips 11_1 to 11_$n$ may include a memory device for storing data. For example, each of the first to $n^{th}$ memory chips to 11_1 to 11_$n$ may include a Synchronous DRAM (SDRAM) device which operates in synchronization with a clock signal of the system. Although it is described as an example that each of the first to $n^{th}$ memory chips 11_1 to 11_$n$ includes the SDRAM device, the present embodiment may not be limited thereto. For example, each of the first to $n^{th}$ memory chips 11_1 to 11_$n$ may include a Resistive RAM (RRAM) device, a Phase RAM (PRAM) device, a Magnetic RAM (MRAM) device, or a Spin Transfer Torque MRAM (STT-MRAM) device. In the meantime, each of the first to $n^{th}$ memory chips 11_1 to 11_$n$ may be a memory chip having one or more semiconductor dies packaged therein.

The memory controller 20 may provide the command/address signal C/A, the control signal CTRL and the clock CLK to the memory module 10 through various kinds of buses. The memory controller 20 may control a read operation of reading the data DQ from the first to $n^{th}$ memory chips 11_1 to 11_$n$ and a write operation of writing the data DQ to the first to $n^{th}$ memory chips 11_1 to 11_$n$. Specifically, the memory controller 20 may provide the command/address signal C/A and the control signal CTRL to the memory module 10 to control transmission/reception of the data DQ to/from memory chips selected from the first to $n^{th}$ memory chips 11_1 to 11_$n$. For reference, the number of memory chips from which data can be simultaneously read during the read operation or the number of memory chips to which data can be simultaneously written during the write operation may be determined depending on the configuration of the memory chips 11_1 to 11_$n$ and the data width of the bus. For example, when the memory chips are supported in X8 configuration and the width of the bus is 72 bits, the read operation or the write operation may be performed simultaneously on 9 memory chips of the memory module 10.

When the memory chips 11_1 to 11_$n$ mounted on the memory module 10 are DDR SDRAMs, pseudo-differential signaling may be generally used for transferring and receiving various signals. For example, the clock CLK may be transferred in the form of a differential clock including a primary clock signal and a secondary clock signal. In an embodiment, the secondary clock signal may have a phase opposite to a phase of the primary clock signal. In order to prevent the signals transferred and received between the memory controller 20 and the memory module 10 from being distorted by impedance mismatching, a termination resistor (not illustrated) may be disposed at the ends of the various kinds of buses.

Since the plurality of memory chips 11_1 to 11_$n$ are disposed in one memory module 10, a skew may occur at the timing when the data DQ, the command/address signal C/A, and the control signal CTRL or the clock CLK that are received from the memory controller 20 are transferred to each chip. For example, the first memory chip 11_1 located closest to the memory controller 20 may receive signals transferred from the memory controller 20 at a faster timing than the $n^{th}$ memory chip 11_$n$ located farthest away from the memory controller 20. The skew may narrow a data eye to degrade the signal integrity (SI). In particular, the higher the operation frequency, the worse the signal integrity (SI).

The following embodiments may propose a method capable of detecting an operation frequency and adjusting the amount of current provided to a buffer circuit according to the detected operation frequency. Thus, signal integrity (SI) may be optimized by increasing the amount of current during a high-frequency operation, and current consumption may be reduced by decreasing the amount of current during a low-frequency operation.

Figure 2:
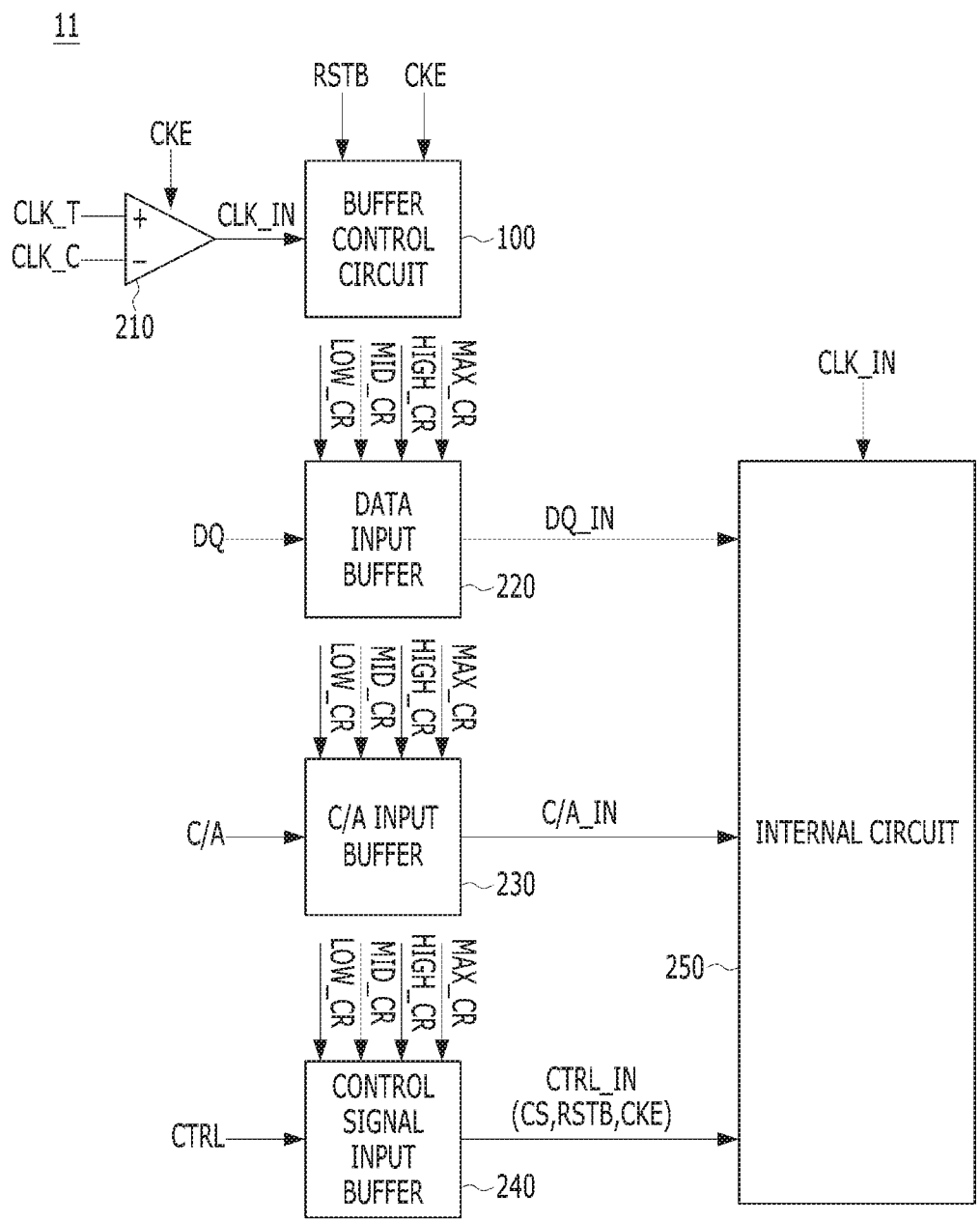
FIG. 2 is a block diagram illustrating a memory device in accordance with an embodiment of the present disclosure.

FIG. 2 is a block diagram illustrating a memory device 11 in accordance with an embodiment of the present disclosure. In FIG. 2, the memory device 11 may correspond to each of the first to $n^{th}$ memory chips 11_1 to 11_$n$ shown in FIG. 1.

Referring to FIG. 2, the memory device 11 may include a buffer control circuit 100, a clock buffer 210, a data input buffer 220, a command/address (C/A) input buffer 230, a control signal input buffer 240 and an internal circuit 250.

Hereinafter, it is assumed that a global reset signal RSTB is activated at a logic low level during a predetermined period. When the global reset signal RSTB pulses (or activates) at a logic low level during a predetermined period after power-up of the memory device 11, the memory device 11 may perform a normal operation after performing a boot-up operation, i.e., an initialization operation. The normal operation may include a read operation, a write operation, an active operation and so on. It is assumed that a clock enable signal CKE is activated at a logic high level. The clock enable signal CKE may be deactivated at a logic low level during a power-down period or a self-refresh period.

The clock buffer 210 may receive a primary clock signal CLK_T and a secondary clock signal CLK_C based on the clock enable signal CKE, and output an internal clock CLK_IN by differentially amplifying the primary clock signal CLK_T and the secondary clock signal CLK_C. In an embodiment, the secondary clock signal CLK_C may have a phase opposite to a phase of the primary clock signal CLK_T. The clock buffer 210 may output the internal clock CLK_IN by differentially amplifying the primary clock signal CLK_T and the secondary clock signal CLK_C during an activation period of the clock enable signal CKE. According to a specification regulated for the memory device, although the clock enable signal CKE is deactivated, the clock buffer 210 may buffer the internal clock CLK_IN to toggle for a predetermined time, i.e., at least 4 tCK.

The buffer control circuit 100 may detect the frequency of the internal clock CLK_IN during a period (hereinafter, referred to as a "standby period") defined by the clock enable signal CKE and the global reset signal RSTB, and activate a current control signal corresponding to the detected frequency among first to fourth current control signals MAX_CR, HIGH_CR, MID_CR and LOW_CR. During the standby period, the buffer control circuit 100 may generate a target clock CLK_5PW (see FIG. 3) by dividing a frequency of the internal clock CLK_IN at a predetermine ratio, and generate the first to fourth current control signals MAX_CR, HIGH_CR, MID_CR and LOW_CR by decoding first to fifth delay clocks DLY_2.5NS, DLY_3.0NS, DLY_3.5NS, DLY_4.5NS and DLY_6.0NS (see FIG. 3) having gradually increasing pulse widths, in synchronization with the target clock CLK_5PW. The standby period may be entered at a deactivation moment of the global reset signal RSTB, that is, a rising edge, or may be entered at a first time D1 after a deactivation moment of the clock enable signal CKE, that is, a falling edge. The standby period may be exited according to a moment at which an activation period of the target clock CLK_5PW terminates, that is, a falling edge. A detailed description of the first time D1 will be described later on.

The data input buffer 220 may buffer data DQ to output internal data DQ_IN. The data input buffer 220 may adjust the amount of current provided thereto based on the first to fourth current control signals MAX_CR, HIGH_CR, MID_CR and LOW_CR.

The C/A input buffer 230 may buffer a command/address signal C/A to output an internal command/address signal C/A_IN. The C/A input buffer 230 may adjust the amount of current provided thereto based on the first to fourth current control signals MAX_CR, HIGH_CR and MID_CR and LOW_CR.

The control signal input buffer 240 may buffer and decode a control signal CTRL to output an internal control signal CTRL_IN. The control signal input buffer 240 may adjust the amount of current provided thereto based on the first to fourth current control signals MAX_CR, HIGH_CR, MID_CR and LOW_CR. The internal control signal CTRL_IN may include the clock enable signal CKE, the global reset signal RSTB and a chip selection signal CS. In some embodiments, the control signal input buffer 240 may be implemented with a decoder.

The internal circuit 250 may control transmission/reception of the data DQ between a memory chip selected from first to $n^{th}$ memory chips 11_1 to 11_n and a memory controller 20 shown in FIG. 1, based on the internal clock CLK_IN, the internal command/address signal C/A_IN and the internal control signal CTRL_IN. The internal circuit 250 of the memory device 11 may include a bank including memory blocks, a sense amplifier, a driver and so on.

Although FIG. 2 illustrates only a configuration related to an input part of the memory device 11 for convenience in description, the present embodiment is not limited thereto. For example, a current control signal may be applied to control a configuration related to an output part of the memory device 11.

The buffer control circuit 100 of the memory device 11 may operate during the initialization operation period before the normal operation after the power-up, or operate during the power-down period or the self-refresh period. That is, the buffer control circuit 100 may detect the frequency of the internal clock CLK_IN during the standby operation period in which the normal operation is not performed, and activate a current control signal corresponding to the detected frequency to adjust the amount of current in the buffer circuits 220, 230 and 240. Accordingly, the buffer control circuit 100 may adjust the amount of current in the buffer circuits 220, 230, and 240 without affecting the normal operation of the memory device 11.

Figure 3:
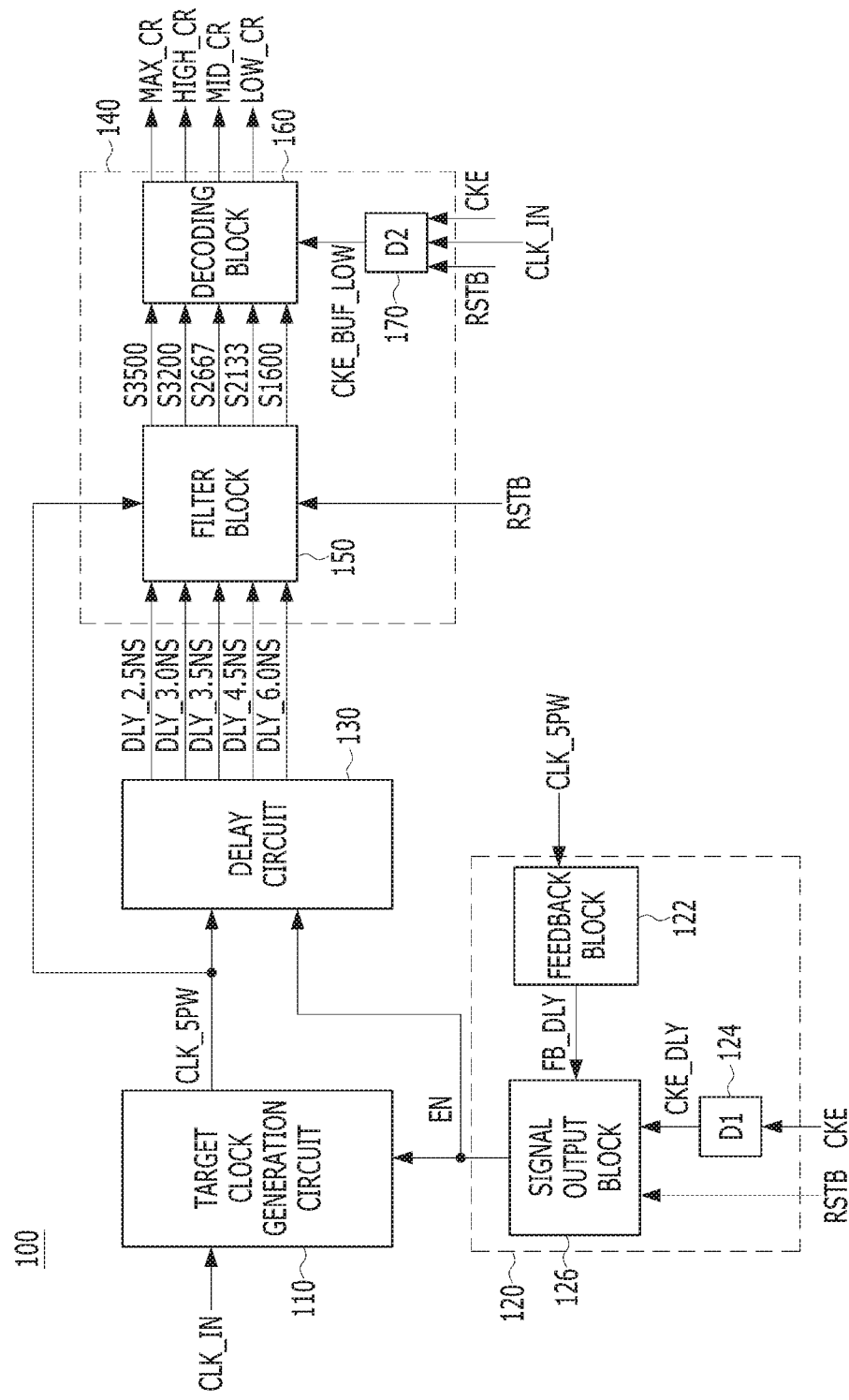
FIG. 3 is a detailed diagram of a buffer control circuit shown in FIG. 2.

FIG. 3 is a detailed diagram of the buffer control circuit 100 shown in FIG. 2.

Referring to FIG. 3, the buffer control circuit 100 may include a target clock generation circuit 110, an operation control circuit 120, a delay circuit 130, and a flag detection circuit 140.

The target clock generation circuit 110 may generate the target clock CLK_5PW by dividing a frequency of the internal clock CLK_IN at the set ratio. The target clock generation circuit 110 may be enabled according to an operation control signal EN. In other words, the target clock generation circuit 110 may generate the target clock CLK_5PW during an activation period of the operation control signal EN. The set ratio may be set in consideration of a margin capable of sensing the frequency of the internal clock CLK_IN and the cycle of a clock provided at the lowest frequency by the memory device. Hereafter, a case where the set ratio is set to 5 will be described as an example.

The delay circuit 130 may generate the first to fifth delay clocks DLY_2.5NS, DLY_3.0NS, DLY_3.5NS, DLY_4.5NS and DLY_6.0NS respectively having first to fifth pulse widths in synchronization with the target clock CLK_5PW. The delay circuit 130 may be enabled according to the operation control signal EN. The delay circuit 130 may generate the first to fifth delay clocks DLY_2.5NS, DLY_3.0NS, DLY_3.5NS, DLY_4.5NS and DLY_6.0NS respectively having the first to fifth pulse widths from a rising edge of the target clock CLK_5PW during the activation period of the operation control signal EN.

DDR4 SDRAM has an operation frequency (data transfer rate) of 800 MHz (DDR4-1600), 933 MHz (DDR4-1866), 1066 MHz (DDR4-2133), 1200 MHz (DDR4-2400) or 1333 MHz (DDR4-2667), and the range of the operation frequency has recently expanded to 1466 MHz (DDR4-2933), 1,600 MHz (DDR4-3200) or 1,750 MHz (DDR4-3500). In the present embodiment, when the target clock CLK_5PW is generated by dividing a frequency of the internal clock CLK_IN by 5, the first to fifth pulse widths may be set to 2.5 ns, 3 ns, 3.5 ns, 4.5 ns and 6 ns, respectively, as delay values that gradually increase. That is, the first pulse width may be set to 2.5 ns to detect a case where the data transfer rate is 3500 MT/s or higher. The second pulse width may be set to 3.0 ns to detect a case where the data transfer rate is 3200 MT/s or higher and less than 3500 MT/s. The third pulse width may be set to 3.5 ns to detect a case where the data transfer rate is 2667 MT/s or higher and less than 3200 MT/s. The fourth pulse width may be set to 4.5 ns to detect a case where the data transfer rate is 2133 MT/s or higher and less than 2667 MT/s. The fifth pulse width may be set to 6.0 ns to detect a case where the data transfer rate is less than 2133 MT/s. However, the present embodiment is not limited thereto, and a plurality of pulse widths may be set according to the frequency of the internal clock CLK_IN.

The operation control circuit 120 may generate the operation control signal EN based on the target clock CLK_5PW, the global reset signal RSTB and the clock enable signal CKE. The operation control circuit 120 may activate the operation control signal EN according to the deactivation moment, i.e., the rising edge, of the global reset signal RSTB or activate the operation control signal EN after the first time D1 passes from the deactivation moment, i.e., the falling edge, of the clock enable signal CKE. The first time D1 may be set to a time corresponding to a time (tCKSRE), e.g., minimum 10 ns, which is a valid clock requirement after a self-refresh mode entry SRE or a power down mode entry PDE. In other words, considering that the internal clock CLK_IN may be inputted during the time (tCKSRE), the operation control circuit 120 may activate the operation control signal EN at a moment when the time (tCKSRE) passes after the clock enable signal CKE is deactivated, and control the target clock generation circuit 110 and the delay circuit 130 to operate.

More specifically, the operation control circuit 120 may include a feedback block 122, a first delay block 124, and a signal output block 126.

The feedback block 122 may generate a feedback signal FB_DLY that pulses for a set period, based on the target clock CLK_5PW. For example, the feedback block 122 may generate the feedback signal FB_DLY that pulses (or activates) for the set period, in response to a falling edge of the target clock CLK_5PW.

The first delay block 124 may generate a first delay signal CKE_DLY that pulses (or activates) for a set period after the first time D1 passed from the deactivation moment, i.e., the falling edge, of the clock enable signal CKE.

The signal output block 126 may output the operation control signal EN that is activated according to the global reset signal RSTB or the first delay signal CKE_DLY and is deactivated according to the feedback signal FB_DLY. For example, the signal output block 126 may activate the operation control signal EN in response to a rising edge of the global reset signal RSTB or a rising edge of the first delay signal CKE_DLY, and deactivate the operation control signal EN in response to a rising edge of the feedback signal FB_DLY.

The flag detection circuit 140 may generate first to fifth flag signals S3500, S3200, S2667, S2133 and S1600 by filtering the first to fifth delay clocks DLY_2.5NS, DLY_3.0NS, DLY_3.5NS, DLY_4.5NS and DLY_6.0NS based on the target clock CLK_5PW, and generate the first to fourth current control signals MAX_CR, HIGH_CR, MID_CR and LOW_CR by decoding the first to fifth flag signals S3500, S3200, S2667, S2133 and S1600. The flag detection circuit 140 may be initialized according to the global reset signal RSTB. The flag detection circuit 140 may generate the first to fourth current control signals MAX_CR, HIGH_CR, MID_CR and LOW_CR so that the amount of current in the buffer circuits 220, 230 and 240 shown in FIG. 2 may be minimized after a second time D2 passes from the deactivation moment, i.e., the falling edge, of the dock enable signal CKE. The second time D2 may be shorter than the first time D1. The second time D2, which corresponds to a command path disable delay time tCPDED, may be set to a predetermined cycle of the internal clock CLK_IN, for example, 4 tCK. In other words, considering that the command/address signal C/A may be additionally inputted during the tCPDED, the flag detection circuit 140 may generate the first to fourth current control signals MAX_CR, HIGH_CR, MID_CR and LOW_CR so that the amount of current of the buffer circuits 220, 230 and 240 may be minimized, at a moment when the tCPDED passes after the clock enable signal CKE is deactivated.

More specifically, the flag detection circuit 140 may include a filter block 150, a decoding block 160, and a second delay block 170.

The filter block 150 may generate the first to fifth flag signals S3500, S3200, S2667, S2133 and S1600 by filtering the first to fifth delay clocks DLY_2.5NS, DLY_3.0NS, DLY_3.5NS, DLY_4.5NS and DLY_6.0NS based on the target clock CLK_5PW. The filter block 150 may be initialized according to the global reset signal RSTB.

The second delay block 170 may generate a second delay signal CKE_BUF_LOW by delaying the clock enable signal CKE by the second time D2 shorter than the first time D1 in response to the internal clock CLK_IN. The second delay block 170 may be initialized according to the global reset signal RSTB.

The decoding block 160 may generate the first to fourth current control signals MAX_CR, HIGH_CR, MID_CR and LOW_CR by combining neighboring signals among the first to fifth flag signals S3500, S3200, S2667, S2133 and S1600. When the second delay signal CKE_BUF_LOW is activated, the decoding block 160 may generate the first to fourth current control signals MAX_CR, HIGH_CR, MID_CR and LOW_CR to minimize the amount of current in the buffer circuits 220, 230 and 240. For example, the decoding block 160 may activate the fourth current control signal LOW_CR when the second delay signal CKE_BUF_LOW is activated.

FIG. 4 is a table for describing a relationship among current consumption depending on the data transfer rate of the memory device and signals of the buffer control circuit 100.

FIG. 4 illustrates a relationship among a delay clock, a flag signal and a current control signal depending on the data transfer rate of the memory device.

When the data transfer rate is 3500 MT/s or higher, the first delay clock DLY_2.5NS may be filtered, and the first flag signal S3500 and the first current control signal MAX_CR corresponding to the first delay clock DLY_2.5NS may be activated. When the data transfer rate is 3200 MT/s or higher and less than 3500 MT/s, the first delay clock DLY_2.5NS and the second delay clock DLY_3.0NS may be filtered, and the first and second flag signals S3500 and S3200 and the second current control signal HIGH_CR corresponding to the first and second delay clocks DLY_2.5NS and DLY_3.0NS may be activated. When the data transfer rate is 2667 MT/s or higher and less than 3200 MT/s, the first to third delay clocks DLY_2.5NS, DLY_3.0NS and DLY_3.5NS may be filtered, and the first to third flag signals S3500, S3200 and S2667 and the third current control signal MID_CR corresponding to the first to third delay clocks DLY_2.5NS, DLY_3.0NS and DLY_3.5NS may be activated. When the data transfer rate is 2133 MT/s or higher and less than 2667 MT/s, the first to fourth delay clocks DLY_2.5NS, DLY_3.0NS, DLY_3.5NS and DLY_4.5NS may be filtered, and the first to fourth flag signals S3500, S3200, S2667 and S2133 and the fourth current control signal LOW_CR corresponding to the first to fourth delay clocks DLY_2.5NS, DLY_3.0NS, DLY_3.5NS and DLY_4.5NS may be activated. When the data transfer rate is less than 2133 MT/s, the first to fifth delay clocks DLY_2.5NS, DLY_3.0NS, DLY_3.5NS, DLY_4.5NS and DLY_6.0NS may be all filtered, the first to fifth flag signals S3500, S3200, S2667, S2133 and S1600 corresponding to the first to fifth delay clocks DLY_2.5NS, DLY_3.0NS, DLY_3.5NS, DLY_4.5NS and DLY_6.0NS may be all activated, and the first to fourth current control signals MAX_CR, HIGH_CR, MID_CR and LOW_CR may be all deactivated.

Figure 5:
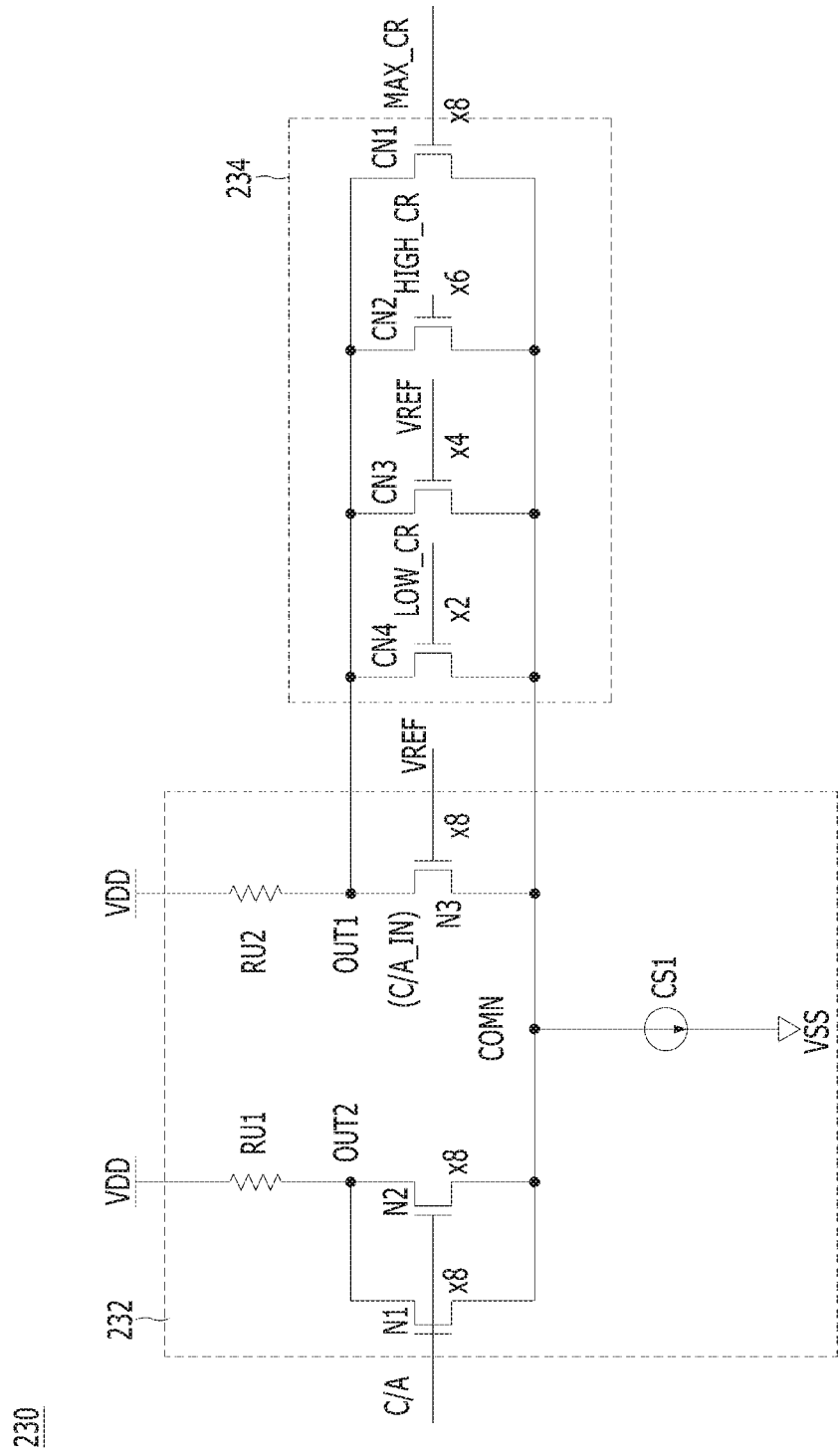
FIG. 5 is a detailed diagram of a command/address input buffer shown in FIG. 2.

FIG. 5 is a detailed diagram of a buffer circuit the command/address (C/A) input buffer 230 shown in FIG. 2. The buffer circuit may include the data input buffer 220, the command/address (C/A) input buffer 230 and the control signal input buffer 240 which are shown in FIG. 2, and FIG. 5 illustrates the command/address (C/A) input buffer 230 as an example of the buffer circuit.

Referring to FIG. 5, the C/A input buffer 230 may include a differential amplification block 232 and a current amount adjustment block 234.

The differential amplification block 232 may differentially amplify a reference voltage VREF and the address/command signal C/A to output the internal command/address signal C/A_IN. The current amount adjustment block 234 may adjust the amount of current supplied to the differential amplification block 232 based on the first to fourth current control signals MAX_CR, HIGH_CR, MID_CR, and LOW_CR.

The differential amplification block 232 may be implemented with a WIDLAR current source. For example, the differential amplification block 232 may include a first resistor RU1 coupled between a power source voltage VDD terminal and a second output node OUT2, a second resistor RU2 coupled between the power source voltage VDD terminal and a first output node OUT1, first and second transistors N1 and N2 coupled in parallel to form a current path between the second output node OUT2 and a common node COMN in response to the command/address signal C/A, a third transistor N3 for forming a current path between the first output node OUT1 and the common node COMN in response to the reference voltage VREF, and a current source CS1 coupled between the common node COMN and a ground voltage VSS terminal to supply a bias. The internal command/address signal C/A_IN may be outputted from the first output node OUT1.

The current amount adjustment block 234 may include first to fourth control transistors CN1 to CN4 for adjusting the amount of current flowing between the first output node OUT1 and the common node COMN in response to the first to fourth current control signals MAX_CR, HIGH_CR, MID_CR and LOW_CR. The size (W/L, ×8) of the first control transistor CN1 receiving the first current control signal MAX_CR may be larger than the size (×6) of the second control transistor CN2 receiving the second current control signal HIGH_CR. The size (×6) of the second control transistor CN2 may be larger than the size (×4) of the third control transistor CN3 receiving the third current control signal MID_CR. The size (×4) of the third control transistor CN3 may be larger than the size (×2) of the fourth control transistor CN4 receiving the fourth current control signal LOW_CR.

For reference, the sizes of the first and second transistors N1 and N2 of the differential amplification block 232 may be set to minimize a mismatch with the first to fourth control transistors CN1 to CN4 of the current amount adjustment block 234 (e.g., W/L=×8). However, this is merely an example, and the numbers and sizes of the first and second transistors N1 and N2 may be adjusted.

According to the aforementioned configuration, the current amount adjustment block 234 may additionally provide the largest amount of current to the differential amplification block 232 when the first current control signal MAX_CR is activated, additionally provide the smallest amount of current (hereinafter referred to as a "minimum amount of current") to the differential amplification block 232 when the fourth current control signal LOW_CR is activated, and not provide an additional amount of current to the differential amplification block 232 when all of the first to fourth current control signals MAX_CR, HIGH_CR, MID_CR and LOW_CR are deactivated. Accordingly, as shown in FIG. 4, the buffer circuit may be controlled to increase the amount of current when a high-speed operation is performed.

Hereinafter, a detailed configuration of the buffer control circuit 100 in accordance with an embodiment of the present disclosure will be described with reference to drawings.

Figure 6:
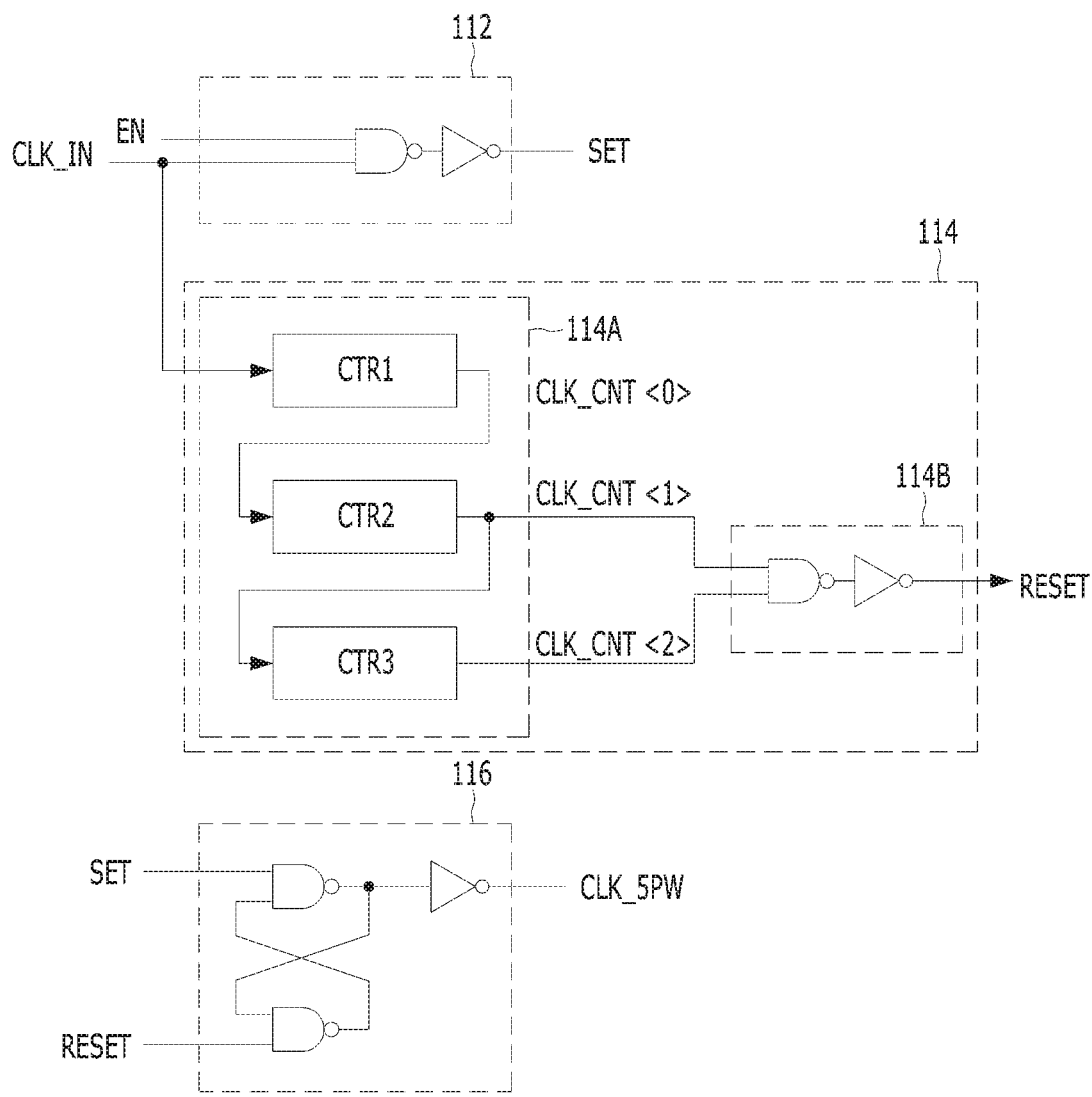
FIG. 6 is a detailed diagram of a target clock generation circuit shown in FIG. 3.

FIG. 6 is a detailed diagram of the target clock generation circuit 110 shown in FIG. 3, according to an embodiment of the present disclosure.

Referring to FIG. 6, the target clock generation circuit 110 may include a set signal generation block 112, a reset signal generation block 114 and a latch block 116.

The set signal generation block 112 may generate a set signal SET based on the operation control signal EN and the internal clock CLK_IN. The set signal generation block 112 may output the internal clock CLK_IN as the set signal SET during the activation period of the operation control signal EN. The set signal generation block 112 may include logic gates that receive the operation control signal EN and the internal clock CLK_IN and perform an AND operation to output the set signal SET.

The reset signal generation block 114 may generate a multi-bit counting signal CLK_CNT<0:2> by counting the internal clock CLK_IN. When the multi-bit counting signal CLK_CNT<0:2> reaches a target value, the reset signal generation block 114 may generate a local reset signal RESET.

More specifically, the reset signal generation block 114 may include a counter 114A and a signal combiner 114B.

The counter 114A may generate the multi-bit counting signal CLK_CNT<0:2> by counting how many times the internal clock CLK_IN toggles. For example, the counter 114A may include first to third counters CTR1 to CTR3 for receiving and dividing a frequency of the internal clock CLK_IN to output the respective bits of the multi-bit counting signal CLK_CNT<0:2>.

The signal combiner 114B may output the local reset signal RESET that pulses for a set period when the count value of the multi-bit counting signal CLK_CNT<0:2> reaches the target value, for example, 6. For example, the signal combiner 114B may include logic gates that perform an AND operation on the second bit CLK_CNT<1> of the multi-bit counting signal CLK_CNT<0:2> outputted from the second counter CTR2 and the third bit CLK_CNT<2> outputted from the third counter CTR3.

The latch block 116 may output the target clock CLK_5PW activated according to the set signal SET and deactivated according to the local reset signal RESET. In an embodiment, the latch block 116 may include logic gates constituting an SR latch.

The target clock generation circuit 110 may generate the target clock CLK_5PW having a cycle corresponding to 5 times that of the internal clock CLK_IN during the activation period of the operation control signal EN.

Figure 7A:
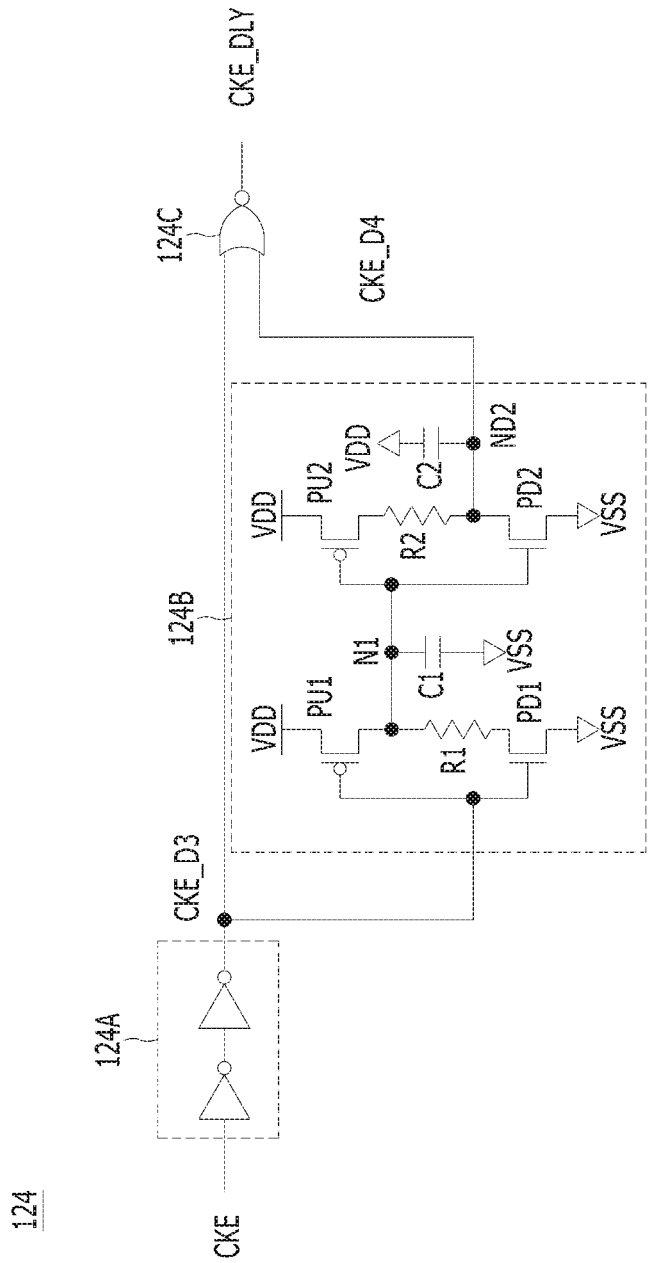
FIGS. 7A and 7B are detailed diagrams illustrating a first delay block and a signal output block of an operation control circuit shown in FIG. 3.

FIG. 7A is a detailed diagram of the first delay block 124 included in the operation control circuit 120 shown in FIG. 3, according to an embodiment of the present disclosure.

Referring to FIG. 7A, the first delay block 124 may include a logic delay 124A, an RC delay 124B, and a pulse combiner 124C.

The logic delay 124A, which is composed of an even number of inverter chains, may delay the clock enable signal CKE by a third time D3 to output a third delay signal CKE_D3.

The RC delay 124B, which is composed of resistors and capacitors, may delay the third delay signal CKE_D3 by a fourth time D4 to output a fourth delay signal CKE_D4. For example, the RC delay 124B may include a first pull-up transistor PU1, a first resistor R1, a first pull-down transistor PD1, a first capacitor C1, a second pull-up transistor PU2, a second resistor R2, a second pull-down transistor PD2 and a second capacitor C2. The first pull-up transistor PU1 may be coupled between the power source voltage VDD terminal and a first node ND1, and receive the third delay signal CKE_D3 through the gate thereof. The first resistor R1 may have one end coupled to the first node ND1. The first pull-down transistor PD1 may be coupled between the other end of the first resistor R1 and the ground voltage VSS terminal, and receive the third delay signal CKE_D3 through the gate thereof. The first capacitor C1 may be coupled between the first node ND1 and the ground voltage VSS terminal. The second pull-up transistor PU2 may be coupled between the power source voltage VDD terminal and a second node ND2, and receive a signal of the first node ND1 through the gate thereof. The second resistor R2 may have one end coupled to the second node ND2. The second pull-down transistor PD2 may be coupled between the other end of the second resistor R2 and the ground voltage VSS terminal, and receive the signal of the first node ND1 through the gate thereof. The second capacitor C2 may be coupled between the second node ND2 and the power source voltage VDD terminal. The fourth delay signal CKE_D4 may be outputted from the second node ND2.

The pulse combiner 124C may combine the third delay signal CKE_D3 and the fourth delay signal CKE_D4 to output the first delay signal CKE_DLY. The pulse combiner 124C may include a logic gate that performs a NOR operation on the third delay signal CKE_D3 and the fourth delay signal CKE_D4. Thus, the pulse combiner 124C may output the first delay signal CKE_DLY that pulses during a period in which both of the third delay signal CKE_D3 and the fourth delay signal CKE_D4 are at a logic low level.

Accordingly, the first delay block 124 may generate the first delay signal CKE_DLY that pulses (or activates) during a set period after a time obtained by adding up the third and fourth times D3 and D4 from the deactivation moment of the clock enable signal CKE. In other words, the first time D1 may be set to the sum of the third time D3 and the fourth time D4. Since the delay amount of the RC delay 124B, i.e., the fourth time D4, is relatively larger than the delay amount of the logic delay 124A, i.e., the third time D3, the first time D1 may be mostly determined by the fourth time D4.

Figure 7B:
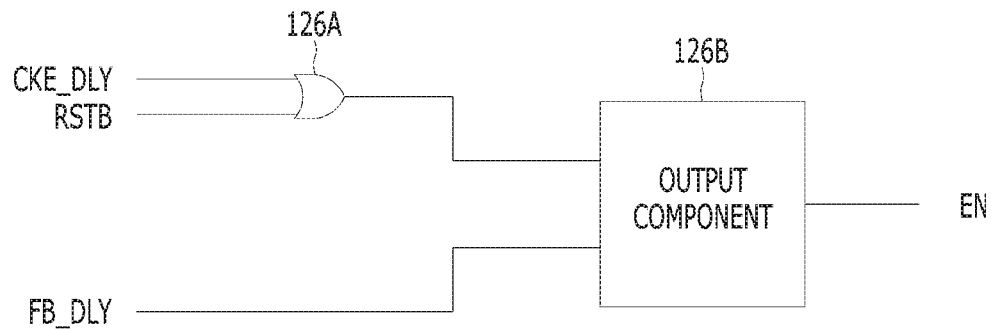

FIG. 7B is a detailed diagram illustrating the signal output block 126 of the operation control circuit 120 shown in FIG. 3, according to an embodiment of the present disclosure.

Referring to FIG. 7B, the signal output block 126 may include a logic gate 126A for performing an OR operation on the global reset signal RSTB and the first delay signal CKE_DLY, and an output component 126B for outputting the operation control signal EN which is activated according to an output of the logic gate 126A and deactivated according to the feedback signal FB_DLY. The output component 126B may be configured with an SR latch using the output of the logic gate 126A as a set signal and the feedback signal FB_DLY as a reset signal.

Figure 8:
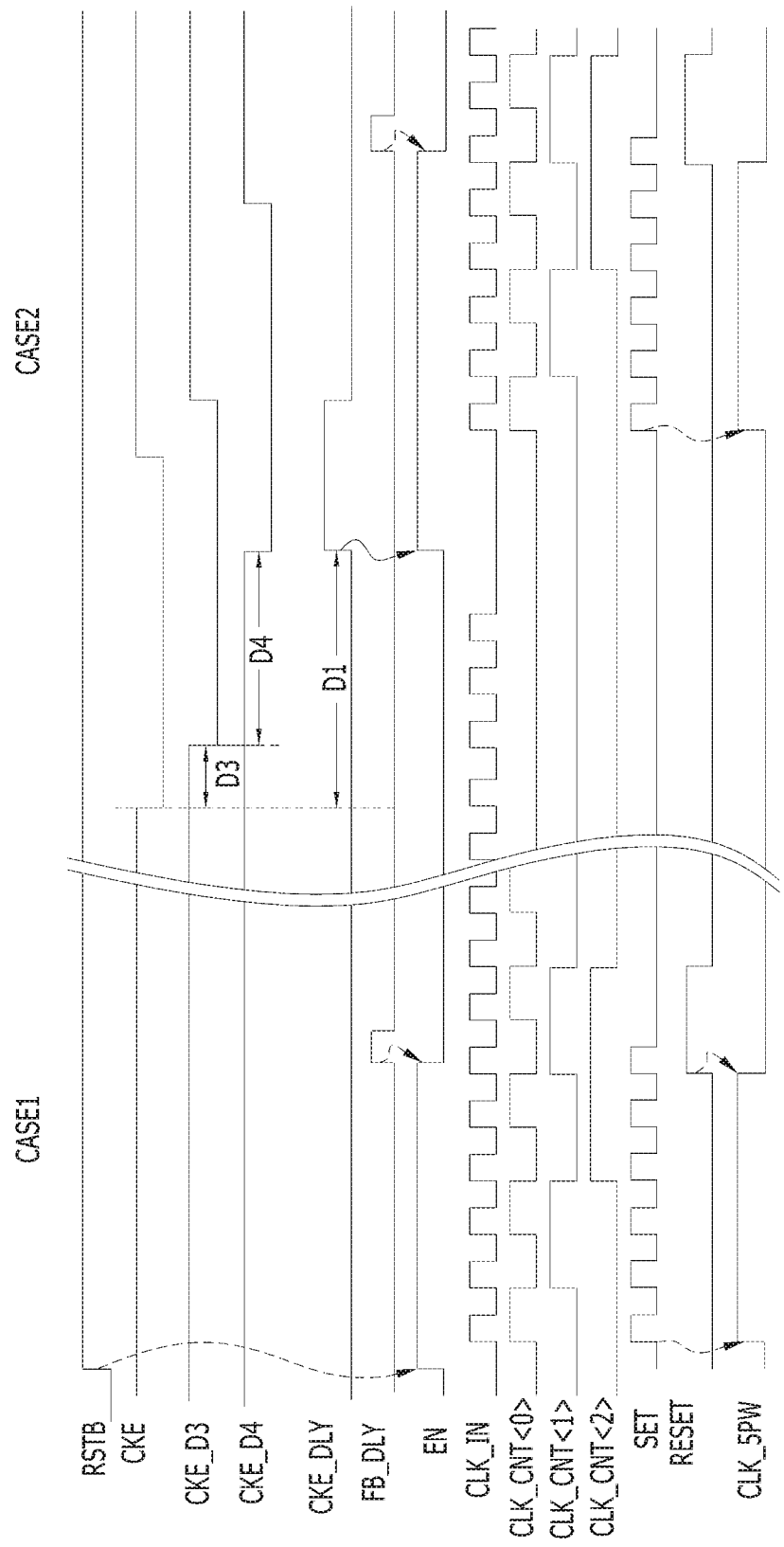
FIG. 8 is a timing diagram for describing operations of the target clock generation circuit and the operation control circuit shown in FIGS. 6, 7A and 7B.

FIG. 8 is a timing diagram for describing operations of the target clock generation circuit 110 and the operation control circuit 120 shown in FIGS. 6 and 7.

FIG. 8 shows a case CASE1 where the global reset signal RSTB pulses to a logic low level after the power-up and a case CASE1 where the clock enable signal CKE is deactivated to a logic low level in case of an entry into the power-down period or the self-refresh period.

In the case CASE1, the signal output block 126 of the operation control circuit 120 may activate the operation control signal EN based on the deactivation moment, i.e., the rising edge, of the global reset signal RSTB. At this time, when the clock enable signal CKE is activated to a logic high level, the internal clock CLK_IN starts to toggle.

The set signal generation block 112 of the target clock generation circuit 110 may output the internal clock CLK_IN as the set signal SET during the activation period of the operation control signal EN, and the latch block 116 may activate the target clock CLK_5PW based on the set signal SET. The reset signal generation block 114 may generate the multi-bit counting signal CLK_CNT<0:2> by counting the internal clock CLK_IN. When the multi-bit counting signal CLK_CNT<0:2> reaches the target value, the reset signal generation block 114 may generate the local reset signal RESET. The latch block 116 may deactivate the target clock CLK_5PW based on the local reset signal RESET.

The feedback block 122 of the operation control circuit 120 may generate the feedback signal FB_DLY that pulses during a set period, in response to the falling edge of the target clock CLK_5PW, and the signal output block 126 may deactivate the operation control signal EN based on the feedback signal FB_DLY. Accordingly, the target clock CLK_5PW having a cycle corresponding to 5 times that of the internal clock CLK_IN may be generated during the activation period of the operation control signal EN.

In the case CASE2, the logic delay 124A of the first delay block 124 may delay the clock enable signal CKE by the third time D3 to output the third delay signal CKE_D3. The RC delay 124B may delay the third delay signal CKE_D3 by the fourth time D4 to output the fourth delay signal CKE_D4. The pulse combiner 124C may combine the third delay signal CKE_D3 and the fourth delay signal CKE_D4 to output the first delay signal CKE_DLY. Accordingly, the first delay block 124 may generate the first delay signal CKE_DLY that pulses during a set period after the first time D1 of approximately 10 ns passes from the deactivation time of the clock enable signal CKE. For reference, according to the specification, the internal clock CLK_IN may toggle for a predetermined clock although the clock enable signal CKE is deactivated.

The signal output block 126 of the operation control circuit 120 may activate the operation control signal EN based on the deactivation moment, i.e., the rising edge, of the first delay signal CKE_DLY. Subsequently, when the clock enable signal CKE is activated to a logic high level in case of an exit from the power-down period or the self-refresh period, the internal clock CLK_IN may start to toggle.

The set signal generation block 112 of the target clock generation circuit 110 may output the internal clock CLK_IN as the set signal SET during the activation period of the operation control signal EN, and the latch block 116 may activate the target clock CLK_5PW based on the set signal SET. The reset signal generation block 114 may generate the local reset signal RESET when the counting signal CLK_CNT<0:2> reaches the target value. The latch block 116 may deactivate the target clock CLK_5PW based on the local reset signal RESET.

The feedback block 122 may generate the feedback signal FB_DLY that pulses during a set period, in response to the falling edge of the target clock CLK_5PW, and the signal output block 126 may deactivate the operation control signal EN based on the feedback signal FB_DLY. Accordingly, the target clock CLK_5PW having a cycle corresponding to 5 times that of the internal clock CLK_IN may be generated during the activation period of the operation control signal EN.

Figure 9:
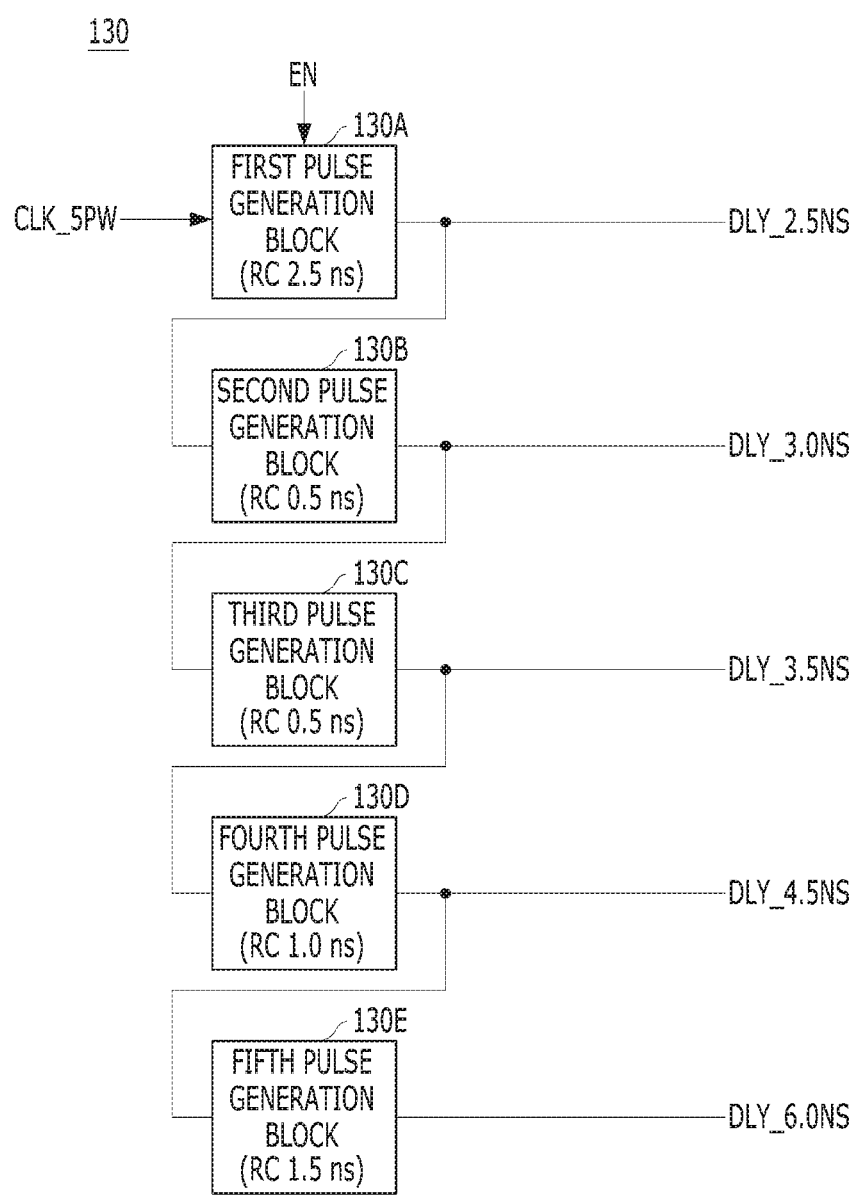
FIG. 9 is a detailed diagram of a delay circuit shown in FIG. 3.

FIG. 9 is a detailed diagram of the delay circuit 130 shown in FIG. 3, according to an embodiment of the present disclosure.

Referring to FIG. 9, the delay circuit 130 may include first to fifth pulse generation blocks 130A to 130E coupled in series.

The first pulse generation block 130A may be activated according to the operation control signal EN, and output the first delay clock DLY_2.5NS having a first pulse width of 2.5 ns, for example, from a rising edge of the target clock CLK_5PW. The second to fifth pulse generation blocks 130B to 130E may receive the signals from the respective previous stages, and generate the second to fifth delay clocks DLY_3.0NS, DLY_3.5NS, DLY_4.5NS and DLY_6.0NS having second to fifth pulse widths from the rising edge of the target clock CLK_5PW, respectively. Although FIG. 9 illustrates five pulse generation blocks, this is merely for convenience and illustrative purposes. That is, the number of pulse generation blocks may vary depending on an embodiment.

Figure 10:
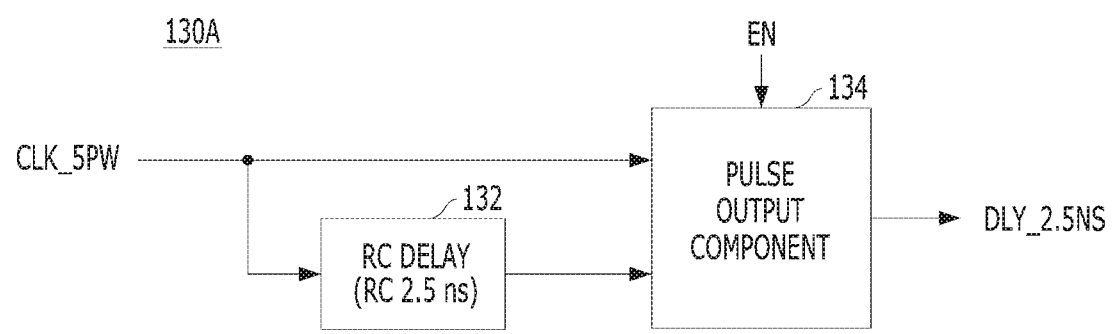
FIG. 10 is a detailed diagram of a first pulse generation block shown in FIG. 9.

FIG. 10 is a detailed diagram illustrating the first pulse generation block 130A shown in FIG. 9, according to an embodiment of the present disclosure.

Referring to FIG. 10, the first pulse generation block 130A may include an RC delay 132 and a pulse output component 134.

The RC delay 132, which is composed of resistors and capacitors, may delay the target clock CLK_5PW by a set time to output a fifth delay signal CLK_5PW_D5. The RC delay 132 (see FIG. 10) may have substantially the same configuration as the RC delay 124B of the first delay block 124 described above with reference to FIG. 7A. The RC delay 132 may have a delay value corresponding to the first pulse width, for example, 2.5 ns.

The pulse output component 134 may be enabled according to the operation control signal EN, and output the first delay clock DLY_2.5NS which is activated according to the target clock CLK_5PW and deactivated according to the fifth delay signal CLK_5PW_D5. The pulse output component 134 may be configured as an SR latch using the target clock CLK_5PW as a set signal and the fifth delay signal CLK_5PW_D5 as a reset signal.

The second to fifth pulse generation blocks 130B to 130E may have substantially the same configuration as the first pulse generation block 130A, except that the operation control signal EN is inputted.

In this case, the RC delay of the second pulse generation block 130B may have a delay value corresponding to 0.5 ns. Accordingly, the second pulse generation block 130B may output the second delay clock DLY_3.0NS having a second pulse width of 3.0 ns, for example, from the rising edge of the target clock CLK_5PW. In other words, the sum of the delay value of the RC delay of the first pulse generation block 130A and the delay value of the RC delay of the second pulse generation block 130B may be set to the second pulse width.

In this manner, the RC delay of the third pulse generation block 130C may output the third delay clock DLY_3.5NS having a delay value corresponding to 0.5 ns and a third pulse width of 3.5 ns, for example, from the rising edge of the target clock CLK_5PW. The RC delay of the fourth pulse generation block 130D may output the fourth delay clock DLY_4.5NS having a delay value corresponding to 1.0 ns and a fourth pulse width of 4.5 ns, for example, from the rising edge of the target clock CLK_5PW. The RC delay of the fifth pulse generation block 130E may output the fifth delay clock DLY_6.0NS having a delay value corresponding to 1.5 ns and a fifth pulse width of 6.0 ns, for example, from the rising edge of the target clock CLK_5PW.

Figure 11:
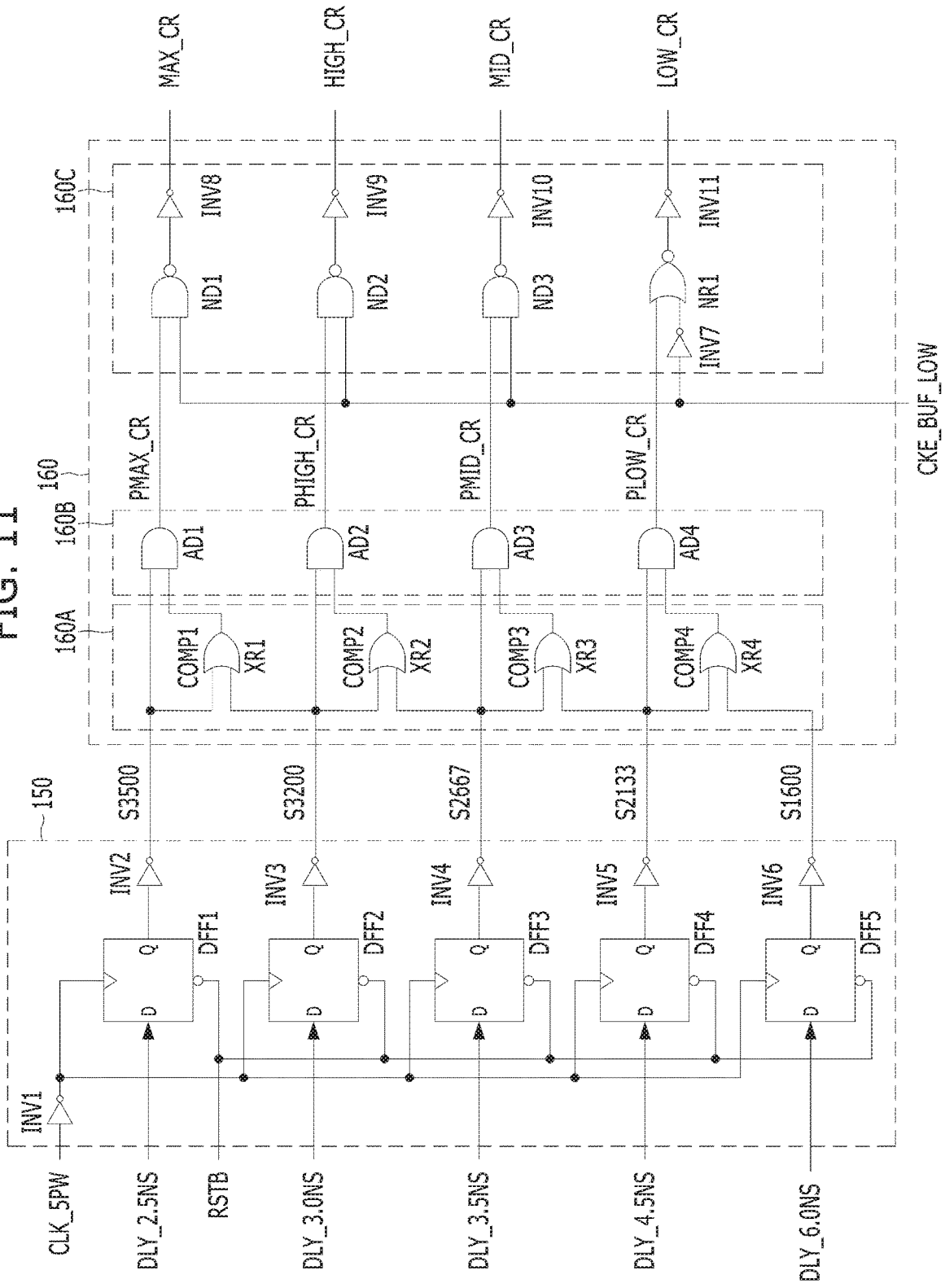
FIG. 11 is a detailed diagram a filter block and a decoding block of a flag detection circuit shown in FIG. 3.

FIG. 11 is a detailed diagram of the filter block 150 and the decoding block 160 included in the flag detection circuit 140 shown in FIG. 3.

Referring to FIG. 11, the filter block 150 may include first to fifth flip-flops DFF1 to DFF5 and first to sixth inverters INV1 to INV6.

The first to fifth flip-flops DFF1 to DFF5 may latch the first to fifth delay clocks DLY_2.5NS, DLY_3.0NS, DLY_3.5NS, DLY_4.5NS and DLY_6.0NS, respectively, based on the target clock CLK_5PW inverted by the first inverter INV1, that is, the falling edge of the target clock CLK_5PW. The first to fifth flip-flops DFF1 to DFF5 may be reset according to the global reset signal RSTB. The second to sixth inverters INV2 to INV6 may invert outputs of the first to fifth flip-flops DFF1 to DFF5, respectively, to output the first to fifth flag signals S3500, S3200, S2667, S2133 and S1600, respectively.

The decoding block 160 may include a first comparator 160A, a second comparator 160B, and a masking component 160C.

The first comparator 160A may output first to fourth comparison signals COMP1 to COMP4 that are activated when neighboring flag signals are different from each other. In an embodiment, the first comparator 160A may include first to fourth XOR gates XR1 to XR4 of which each receives neighboring signals among the first to fifth flag signals S3500, S3200, S2667, S2133 and S1600 and performs a XOR operation on the neighboring signals. For example, the second XOR gate XR2 may output the second comparison signal COMP2 that is activated to a logic high level when the second flag signal S3200 and the third flag signal S2667 are different from each other.

The second comparator 160B may compare the first to fourth comparison signals COMP1 to COMP4 to the first to fourth flag signals S3500, S3200, S2667 and S2133, respectively, to output first to fourth preliminary control signals PMAX_CR, PHIGH_CR, PMID_CR and PLOW_CR. In an embodiment, the second comparator 160B may include first to fourth AND gates AD1 to AD4 corresponding to the first to fourth comparison signals COMP1 to COMP4, respectively. The first to fourth AND gates AD1 to AD4 may perform an AND operation on one corresponding comparison signal of the first to fourth comparison signals COMP1 to COMP4 and one of the first to fourth flag signals S3500, S3200, S2667 and S2133, to output the first to fourth preliminary control signals PMAX_CR, PHIGH_CR, PMID_CR and PLOW_CR. For example, the second AND gate AD2 may output the second preliminary control signal PHIGH_CR that is activated when the second comparison signal COMP2 and the second flag signal S3200 are activated.

The masking component 160C may mask the first to fourth preliminary control signals PMAX_CR, PHIGH_CR, PMID_CR and PLOW_CR based on the second delay signal CKE_BUF_LOW, to output the first to fourth current control signals MAX_CR, HIGH_CR, MID_CR and LOW_CR. When the second delay signal CKE_BUF_LOW is activated to a logic low level, the masking component 160C may output the first to fourth current control signals MAX_CR, HIGH_CR, MID_CR and LOW_CR fixed to a specific logic level, for example, 0001, regardless of the first to fourth preliminary control signals PMAX_CR, PHIGH_CR, PMID_CR and PLOW_CR. When the second delay signal CKE_BUF_LOW is deactivated to a logic high level, the masking component 160C may output the first to fourth preliminary control signals PMAX_CR, PHIGH_CR, PMID_CR and PLOW_CR as the first to fourth current control signals MAX_CR, HIGH_CR, MID_CR and LOW_CR.

In an embodiment, the masking component 160C may include first to third NAND gates ND1 to ND3, seventh to eleventh inverters INV7 to INV11, and a first NOR gate NR1. The first to third NAND gates ND1 to ND3 and the eighth to tenth inverters INV8 to INV10 may perform an AND operation on the second delay signal CKE_BUF_LOW and the first to third preliminary control signals PMAX_CR, PHIGH_CR, and PMID_CR, respectively, to output the first to third current control signals MAX_CR, HIGH_CR, and MID_CR. The seventh inverter INV7 may invert the second delay signal CKE_BUF_LOW. The first NOR gate NR1 and the eleventh inverter INV11 may perform an OR operation on the second delay signal CKE_BUF_LOW and the fourth preliminary control signal PLOW_CR to output the fourth current control signal LOW_CR.

The filter block 150 may filter only a clock having a smaller pulse width than the target clock CLK_5PW among the first to fifth delay clocks DLY_2.5NS, DLY_3.0NS, DLY_3.5NS, DLY_4.5NS and DLY_6.0NS, to output the first to fifth flag signals S3500, S3200, S2667, S2133 and S1600. The decoding block 160 may generate the first to fourth current control signals MAX_CR, HIGH_CR, MID_CR and LOW_CR by decoding the first to fifth flag signals S3500, S3200, S2667, S2133 and S1600. At this time, the decoding block 160 may activate and output the fourth current control signal LOW_CR after the second time D2 passes from the deactivation moment of the clock enable signal CKE, thereby minimizing the amount of current in the buffer circuits 220, 230 and 240.

Figure 12:
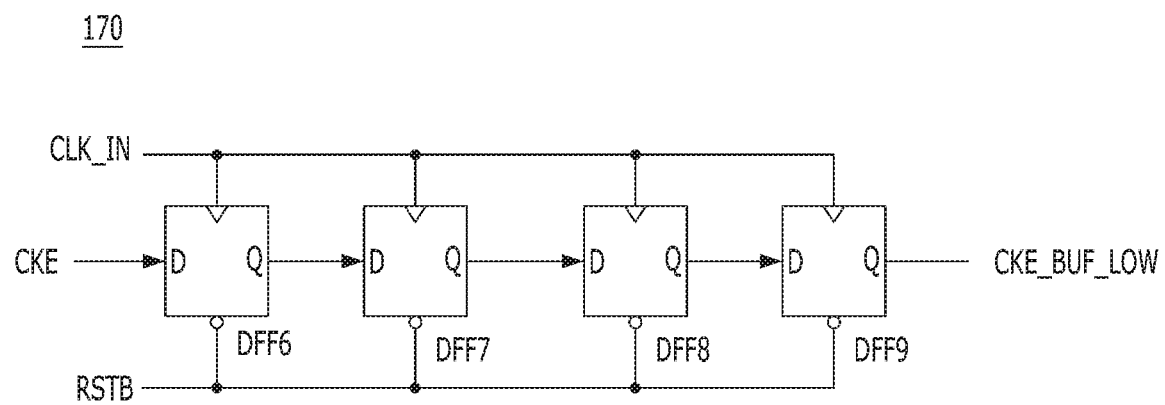
FIG. 12 is a detailed diagram of a second delay block shown in FIG. 3.

FIG. 12 is a detailed diagram of the second delay block 170 of the flag detection circuit 140 shown in FIG. 3, according to an embodiment of the present disclosure.

Referring to FIG. 12, the second delay block 170 may include first to fourth flip-flops DFF6 to DFF9 coupled in series.

The first to fourth flip-flops DFF6 to DFF9 may sequentially delay the clock enable signal CKE in response to the internal clock CLK_IN to output the second delay signal CKE_BUF_LOW. The first to fourth flip-flops DFF6 to DFF9 may be initialized according to the global reset signal RSTB. The first to fourth flip-flops DFF6 to DFF9 may delay the clock enable signal CKE by 4 tCK of the internal clock CLK_IN to output the second delay signal CKE_BUF_LOW.

Hereinafter, an operation of the buffer control circuit 100 will be described with reference to FIGS. 2 to 13.

Figure 13:
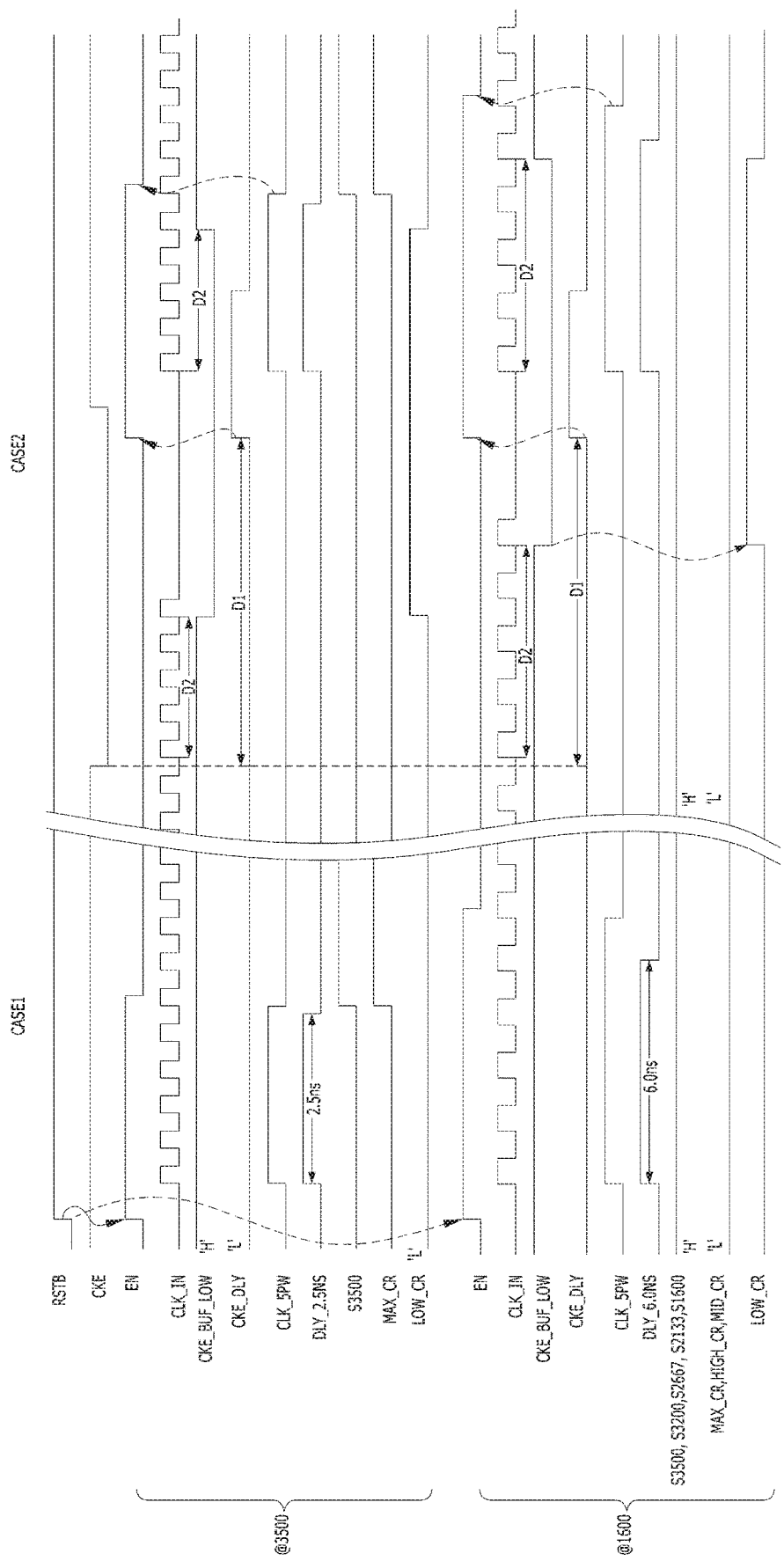
FIG. 13 is a timing diagram for describing an operation of the buffer control circuit in accordance with an embodiment of the present disclosure.

FIG. 13 is a timing diagram for describing the operation of the buffer control circuit 100 in accordance with an embodiment of the present disclosure.

FIG. 13 illustrates a case CASE1 in which the global reset signal RSTB pulses to a logic low level after power-up and a case CASE2 in which the clock enable signal CKE is deactivated to a logic low level in case of an entry into a power-down period or self-refresh period.

In the case CASE1, the operation control circuit 120 may activate the operation control signal EN based on the deactivation moment, i.e., the rising edge, of the global reset signal RSTB. The clock buffer 210 may differentially amplify the primary clock signal CLK_T and the secondary clock signal CLK_C during the activation period of the clock enable signal CKE to output the internal clock CLK_IN. At this time, since the clock enable signal CKE maintains the activation state, the first delay signal CKE_DLY may be fixed to a logic low level, and the second delay signal CKE_BUF_LOW may be fixed to a logic high level.

The target clock generation circuit 110 may generate the target clock CLK_5PW having a cycle corresponding to 5 times that of the internal clock CLK_IN during the activation period of the operation control signal EN. The delay circuit 130 may generate the first to fifth delay clocks DLY_2.5NS and DLY_3.0NS, DLY_3.5NS, DLY_4.5NS and DLY_6.0NS having the first to fifth pulse widths, respectively, from the rising edge of the target clock CLK_5PW during the activation period of the operation control signal EN.

When the data transfer rate is 3500 MT/s or higher, the filter block 150 may filter only the first delay clock DLY_2.5NS having a smaller pulse width than the target clock CLK_5PW among the first to fifth delay clocks DLY_2.5NS, DLY_3.0NS, DLY_3.5NS, DLY_4.5NS and DLY_6.0NS, to output the first flag signal S3500 at a logic high level. The decoding block 160 may decode the first to fifth flag signals S3500, S3200, S2667, S2133 and S1600 to activate the first current control signal MAX_CR. Accordingly, the current amount adjustment block 234 of the buffer circuits 220, 230 and 240 may additionally provide the largest amount of current to the differential amplification block 232 to secure a data eye during a high-frequency operation, thereby optimizing the signal integrity (SI).

When the data transfer rate is less than 2133 MT/s, the filter block 150 may filter all of the first to fifth flag signals DLY_2.5NS, DLY_3.0NS, DLY_3.5NS, DLY_4.5NS and DLY_6.0NS having smaller pulse widths than the target clock CLK_5PW, and output the first to fifth flag signals S3500, S3200, S2667, S2133 and S1600 at a logic high level. The decoding block 160 may decode the first to fifth flag signals S3500, S3200, S2667, S2133 and S1600 to deactivate the first to fourth current control signals MAX_CR, HIGH_CR, MID_CR and LOW_CR. Accordingly, the current amount adjustment block 234 of the buffer circuits 220, 230 and 240 may not additionally provide a current to the differential amplification block 232, thereby reducing the current consumption during a low-frequency operation.

In the case CASE2, according to the specification, the internal clock CLK_IN may toggle by a set number of clocks even though the clock enable signal CKE is deactivated. When the clock enable signal CKE is deactivated, the second delay block 170 may generate the second delay signal CKE_BUF_LOW by delaying the clock enable signal CKE by the second time D2, i.e., 4 tCK, in response to the internal clock CLK_IN. The decoding block 160 may activate the fourth current control signal LOW_CR when the second delay signal CKE_BUF_LOW is activated. Accordingly, the current amount adjustment block 234 can minimize the amount of current supplied to the differential amplification block 232, thereby reducing the current consumption consumed by default.

The first delay block 124 may generate the first delay signal CKE_DLY that pulses during a set period after the first time D1 of approximately 10 ns passes from the deactivation moment of the clock enable signal CKE. The operation control circuit 120 may activate the operation control signal EN based on the first delay signal CKE_DLY.

The target clock generation circuit 110 may generate the target clock CLK_5PW having a cycle corresponding to 5 times that of the internal clock CLK_IN during the activation period of the operation control signal EN. The delay circuit 130 may generate the first to fifth delay clocks DLY_2.5NS, DLY_3.0NS, DLY_3.5NS, DLY_4.5NS and DLY_6.0NS during the activation period of the operation control signal EN.

When the data transfer rate is 3500 MT/s or higher, the flag detection circuit 140 may activate the first current control signal MAX_CR, and the current amount adjustment block 234 may not additionally provide a current to the differential amplification block 232, thereby reducing the current consumption during the low-frequency operation.

On the other hand, when the data transfer rate is less than 2133 MT/s, the flag detection circuit 140 may deactivate the first to fourth current control signals MAX_CR, HIGH_CR, MID_CR and LOW_CR, and the current amount adjustment block 234 may minimize the amount of current supplied to the differential amplification block 232, thereby reducing the default current consumption.

As is apparent from the above descriptions, in the semiconductor device according to various embodiments of the present disclosure, by detecting the frequency of the clock and adjusting the amount of current supplied to the buffer circuit based on the detected frequency, a data eye may be secured during a high-frequency operation so that the signal integrity (SI) may be optimized, and the current consumption may be reduced during a low-frequency operation.

While the present disclosure has been described with respect to specific embodiments, these embodiments are not intended to be restrictive, but rather descriptive. Further, it is noted that the present invention may be achieved in various ways through substitution, change, and modification, by those skilled in the art without departing from the spirit and/or scope of the present disclosure as defined by the following claims.

What is claimed is:

1. A memory device comprising:
a target clock generation circuit suitable for generating a target clock by dividing a frequency of an internal clock at a set ratio;
a delay circuit suitable for generating first to Nth delay clocks having first to Nth pulse widths that gradually increase, in synchronization with the target clock;
a flag detection circuit suitable for filtering the first to Nth delay clocks based on the target clock to generate first to Nth flag signals and decoding the first to Nth flag signals to generate first to (N−1)th current control signals; and
a buffer circuit suitable for adjusting an amount of current based on the first to (N−1)th current control signals, and buffering an externally inputted signal using the adjusted amount of current.

2. The memory device of claim 1, further comprising:
an operation control circuit suitable for generating an operation control signal for enabling the target clock generation circuit and the delay circuit based on the target clock, a global reset signal and a clock enable signal.

3. The memory device of claim 2, wherein the operation control circuit activates the operation control signal based on a deactivation moment of the global reset signal, or activates the operation control signal after a first time passes from a deactivation moment of the clock enable signal, and
the operation control circuit deactivates the operation control signal based on the target clock.

4. The memory device of claim 3, wherein the flag detection circuit generates the first to (N−1)th current control signals so that the amount of current used the buffer circuit is minimized after a second time shorter than the first time passes from the deactivation moment of the clock enable signal.

5. The memory device of claim 4,
wherein the first time corresponds to a time (tCKSRE) which is a valid clock requirement after a self-refresh mode entry (SRE) or a power-down mode entry (PDE),
wherein the second time corresponding to a command path disable delay time (tCPDED) is set to a predetermined cycle of the internal clock.

6. The memory device of claim 2, wherein the operation control circuit includes:
a feedback block suitable for generating a feedback signal that pulses based on the target clock;
a first delay block suitable for outputting a first delay signal that pulses after a first time passes after a deactivation moment of the clock enable signal; and
a signal output block suitable for activating the operation control signal based on the global reset signal or the first delay signal, and deactivating the operation control signal based on the feedback signal.

7. The memory device of claim 2, wherein the target clock generation circuit includes:
a set signal generation block suitable for generating a set signal based on the operation control signal and the internal clock;
a reset signal generation block suitable for generating a counting signal by counting the internal clock, and generating a local reset signal when the counting signal reaches a target value; and
a latch block suitable for activating the target clock based on the set signal, and deactivating the target clock based on the local reset signal.

8. The memory device of claim 2, wherein the delay circuit includes first to Nth pulse generation blocks that are coupled in series to one another,
wherein the first pulse generation block is activated based on the operation control signal, and outputs the first delay clock having the first pulse width from a rising edge of the target clock, and the second to Nth pulse generation blocks receive signals from respective previous stages, and output the second to Nth delay clocks having the second to Nth pulse widths from the rising edge of the target clock.

9. The memory device of claim 1, wherein the flag detection circuit includes:
a filter block suitable for generating the first to Nth flag signals by filtering the first to Nth delay clocks based on the target clock;
a second delay block suitable for generating a second delay signal by delaying a clock enable signal by a second time in response to the internal clock; and
a decoding block suitable for generating the first to (N−1)th current control signals by combining adjacent signals among the first to Nth flag signals, and generating the first to (N−1)th current control signals to minimize the amount of current used the buffer circuit, when the second delay signal is activated.

10. The memory device of claim 9, wherein the filter block includes first to Nth flip-flops which output the first to Nth flag signals by latching the first to Nth delay clocks, respectively, based on a falling edge of the target clock, and are reset based on a global reset signal.

11. The memory device of claim 9, wherein the decoding block includes:
a first comparator suitable for outputting first to (N−1)th comparison signals that are activated when adjacent flag signals among the first to Nth flag signals are different from each other;
a second comparator suitable for comparing the first to (N−1)th comparison signals to the first to (N−1)th flag signals, respectively, to output first to (N−1)th preliminary control signals; and
a masking component suitable for masking the first to (N−1)th preliminary control signals based on the second delay signal to output the first to (N−1)th current control signals.

12. The memory device of claim 1, wherein the buffer circuit includes:
a differential amplification block suitable for amplifying one of data, an address/command signal and a control signal based on a reference voltage; and
a current amount adjustment block suitable for adjusting the amount of current supplied to the differential amplification block based on the first to (N−1)th current control signals.

13. A memory system comprising:
a plurality of memory devices; and
a memory controller suitable for transferring and receiving data to and from the memory devices and providing a command/address signal, a clock enable signal, a global reset signal and an external clock to control the memory devices,
wherein each of the memory devices includes:
a clock buffer circuit suitable for receiving the external clock based on the clock enable signal to output an internal clock;
a buffer control circuit suitable for generating a current control signal corresponding to a frequency of the internal clock during a standby period defined by the clock enable signal and the global reset signal; and
a buffer circuit suitable for adjusting an amount of current based on the current control signal and buffering the command/address signal, the clock enable signal, the global reset signal and the data using the adjusted amount of current.

14. The memory system of claim 13, wherein the buffer control circuit generates a target clock by dividing a frequency of the internal clock at a set ratio and generates the current control signal by decoding a plurality of delay clocks having pulse widths that gradually increase, in synchronization with the target clock, during the standby period.

15. The memory system of claim 14, wherein the standby period is entered at a deactivation moment of the global reset signal or at a first time after a deactivation moment of the clock enable signal, and is exited at a moment when an activation period of the target clock terminates.

16. The memory system of claim 15, wherein the buffer control circuit generates the current control signal so that the amount of current used in the buffer circuit is minimized after a second time shorter than the first time passes from the deactivation moment of the clock enable signal.

17. The memory system of claim 16,
wherein the first time corresponds to a time (tCKSRE) which is a valid clock requirement after a self-refresh mode entry (SRE) or a power-down mode entry (PDE), and
the second time corresponding to a command path disable delay time (tCPDED) is set to a predetermined cycle of the internal clock.

18. The memory system of claim 13, wherein the buffer control circuit includes:
an operation control circuit suitable for generating an operation control signal based on a target clock, the global reset signal and the clock enable signal;
a target clock generation circuit suitable for being enabled based on the operation control signal, and generating the target clock by dividing a frequency of the internal clock at a set ratio;
a delay circuit suitable for being enabled based on the operation control signal, and generating a plurality of delay clocks having pulse widths that gradually increase, in synchronization with the target clock; and
a flag detection circuit suitable for filtering the plurality of delay clocks based on the target clock to generate a plurality of flag signals, and decoding the plurality of flag signals to generate the current control signal.

19. The memory system of claim 18, wherein the operation control circuit includes:
a feedback block suitable for generating a feedback signal that pulses based on the target clock;
a first delay block suitable for outputting a first delay signal that pulses after a first time passes from a deactivation moment of the clock enable signal; and
a signal output block suitable for activating the operation control signal based on the global reset signal or the first delay signal, and deactivating the operation control signal based on the feedback signal.

20. The memory system of claim 18, wherein the flag detection circuit includes:
a filter block suitable for generating the plurality of flag signals buy filtering the plurality of delay clocks based on the target clock;
a second delay block suitable for generating a second delay signal by delaying the clock enable signal by a second time in response to the internal clock; and
a decoding block suitable for generating the current control signal by combining adjacent signals among the plurality of flag signals, and generating the current control signal to minimize the amount of current used in the buffer circuit, when the second delay signal is activated.

21. The memory system of claim 13, wherein the buffer circuit includes:
a differential amplification block suitable for amplifying one of the address/command signal, the clock enable signal, the global reset signal and the data based on a reference voltage; and
a current amount adjustment block suitable for adjusting the amount of current supplied to the differential amplification block based on the current control signal.

22. A buffer circuit comprising:
a differential amplification block suitable for receiving an externally inputted signal and a reference voltage;
a current amount adjustment block suitable for adjusting an amount of current used for receiving the reference voltage based on a current control signal; and
a buffer control circuit suitable for generating the current control signal corresponding to a frequency of a system clock during a standby period.

* * * * *